US009373571B2

(12) United States Patent
Denison et al.

(10) Patent No.: US 9,373,571 B2
(45) Date of Patent: Jun. 21, 2016

(54) INTEGRATING MULTI-OUTPUT POWER CONVERTERS HAVING VERTICALLY STACKED SEMICONDUCTOR CHIPS

(71) Applicant: Texas Instruments Incorporated, Dallas, TX (US)

(72) Inventors: Marie Denison, Plano, TX (US); Brian Ashley Carpenter, Cary, NC (US); Osvaldo Jorge Lopez, Annandale, NJ (US); Juan Alejandro Herbsommer, Allen, TX (US); Jonathan Noquil, Bethlehem, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/938,387

(22) Filed: Nov. 11, 2015

(65) Prior Publication Data

US 2016/0064361 A1     Mar. 3, 2016

Related U.S. Application Data

(62) Division of application No. 14/181,966, filed on Feb. 17, 2014, now Pat. No. 9,214,415.

(60) Provisional application No. 61/810,860, filed on Apr. 11, 2013.

(51) Int. Cl.
*H01L 25/18*     (2006.01)
*H01L 23/495*     (2006.01)
(Continued)

(52) U.S. Cl.
CPC .......... *H01L 23/49575* (2013.01); *H01L 21/50* (2013.01); *H01L 21/561* (2013.01); *H01L 23/49524* (2013.01); *H01L 23/49562* (2013.01);
(Continued)

(58) Field of Classification Search
CPC ... H01L 25/0657; H01L 25/072; H01L 25/18; H01L 24/40
See application file for complete search history.

(56) References Cited

U.S. PATENT DOCUMENTS 7,538,439 B2    5/2009   Fujito et al.
8,431,979 B2    4/2013   Herbsommer et al.
(Continued)

OTHER PUBLICATIONS

Notification of Transmittal of the International Search Report and the Written Opinion of the International Searching Authority, or the Declaration. Date of mailing: Sep. 11, 2014.

*Primary Examiner* — Michele Fan
(74) *Attorney, Agent, or Firm* — Steven A. Shaw; Frank D. Cimino

(57) ABSTRACT

An electronic multi-output device has a substrate including a first pad, a second pad and a plurality of pins. A first chip with a first transistor has a first terminal on one chip surface and a second and third terminals on the opposite chip surface. The first chip with its first terminal is tied to the first pad. A second chip with a second transistor has a first terminal on one chip surface and a second and third terminals on the opposite chip surface. The second chip with its first terminal is tied to the second pad. The second terminals are connected by a discrete first metal clip and a second metal clip to respective substrate pins. A composite third chip has a third and a fourth transistor integrated so that the first terminals of the transistors are on one chip surface. The second terminals are merged into a common terminal. The patterned third terminals are on the opposite chip surface. The first terminals are vertically attached to the first and second metal clips, respectively. The common terminal is connected by a common clip to a substrate pin.

9 Claims, 7 Drawing Sheets

(51) Int. Cl.
| | |
|---|---|
| *H01L 23/00* | (2006.01) |
| *H01L 21/50* | (2006.01) |
| *H01L 25/065* | (2006.01) |
| *H01L 25/07* | (2006.01) |
| *H01L 25/16* | (2006.01) |
| *H01L 25/00* | (2006.01) |
| *H01L 21/56* | (2006.01) |
| *H01L 23/498* | (2006.01) |

(52) U.S. Cl.
CPC ............... *H01L 24/34* (2013.01); *H01L 24/36* (2013.01); *H01L 24/40* (2013.01); *H01L 24/84* (2013.01); *H01L 25/0657* (2013.01); *H01L 25/072* (2013.01); *H01L 25/16* (2013.01); *H01L 25/18* (2013.01); *H01L 25/50* (2013.01); *H01L 23/49838* (2013.01); *H01L 2224/32245* (2013.01); *H01L 2224/40137* (2013.01); *H01L 2224/40139* (2013.01); *H01L 2224/40145* (2013.01); *H01L 2224/40245* (2013.01); *H01L 2224/48091* (2013.01); *H01L 2224/48137* (2013.01); *H01L 2224/48247* (2013.01); *H01L 2924/1301* (2013.01); *H01L 2924/1305* (2013.01); *H01L 2924/1306* (2013.01); *H01L 2924/13091* (2013.01); *H01L 2924/15747* (2013.01); *H01L 2924/181* (2013.01)

(56) References Cited

U.S. PATENT DOCUMENTS

| | | |
|---|---|---|
| 2005/0161794 A1 | 7/2005 | Kato et al. |
| 2007/0120217 A1 | 5/2007 | Otremba |
| 2007/0249092 A1* | 10/2007 | Joshi ..................... H01L 23/492 438/107 |
| 2008/0173991 A1 | 7/2008 | Cruz et al. |
| 2008/0197463 A1 | 8/2008 | Otremba |
| 2008/0224300 A1* | 9/2008 | Otremba ................. H01L 24/33 257/693 |
| 2009/0230518 A1 | 9/2009 | Liu et al. |
| 2010/0171543 A1 | 7/2010 | Korec et al. |
| 2011/0008933 A1* | 1/2011 | Noquil ................ H01L 23/4334 438/108 |
| 2011/0309881 A1 | 12/2011 | Yasuda et al. |
| 2012/0200281 A1 | 8/2012 | Herbsommer et al. |
| 2012/0228696 A1 | 9/2012 | Carpenter et al. |
| 2013/0075884 A1 | 3/2013 | Gong et al. |
| 2013/0154073 A1 | 6/2013 | Massie et al. |
| 2013/0278328 A1 | 10/2013 | Denison et al. |
| 2014/0063744 A1 | 3/2014 | Lopez et al. |

* cited by examiner

US 9,373,571 B2

INTEGRATING MULTI-OUTPUT POWER CONVERTERS HAVING VERTICALLY STACKED SEMICONDUCTOR CHIPS

CROSS REFERENCE TO RELATED APPLICATIONS

This application is a Divisional of and claims priority to U.S. patent application Ser. No. 14/181,966, filed on Feb. 17, 2014, which claims priority to Provisional Application No. 61/810,860 filed on Apr. 11, 2013.

FIELD

The present invention is related in general to the field of semiconductor devices and processes, and more specifically to the structure and fabrication method of multi-phase half-bridges and multi-output power switches with vertically stacked semiconductor chips, especially of different down-terminal types.

DESCRIPTION OF RELATED ART

Among the popular families of power supply circuits are the power switching devices for converting one DC voltage to another DC voltage. Particularly suitable for the emerging power delivery requirements are the Power Blocks with two power MOS field effect transistors (FETs) connected in series and coupled together by a common switch node; such assembly is also called a half bridge. When a regulating driver and controller is added, the assembly is referred to as Power Stage or, more commonly, as synchronous Buck converter. In the synchronous Buck converter, the control FET chip, also called the high-side switch, is connected between the supply voltage $V_{IN}$ and the LC output filter, and the synchronous (sync) FET chip, also called the low side switch, is connected between the LC output filter and ground potential. The gates of the control FET chip and the sync FET chip are connected to a semiconductor chip including the circuitry for the driver of the converter and the controller; the chip is also connected to ground potential.

For many of today's power switching devices, the chips of the power MOSFETs and the chip of the driver and controller IC are assembled horizontally side-by-side as individual components. Each chip is typically attached to a rectangular or square-shaped pad of a metallic leadframe; the pad is surrounded by leads as output terminals. In other power switching devices, the power MOSFET chips and the driver-and-controller IC are assembled horizontally side-by-side on a single leadframe pad, which in turn is surrounded on all four sides by leads serving as device output terminals. The leads are commonly shaped without cantilever extensions, and arranged in the manner of Quad Flat No-Lead (QFN) or Small Outline No-Lead (SON) devices. The electrical connections from the chips to the leads may be provided by bonding wires, which introduce, due to their lengths and resistances, significant parasitic inductance into the power circuit. In some recently introduced advanced assemblies, clips substitute for many connecting wires. These clips are wide and introduce minimum parasitic inductance. Each assembly is typically packaged in a plastic encapsulation, and the packaged components are employed as discrete building blocks for board assembly of power supply systems.

In other recently introduced schemes, the control FET chip and the sync FET chip are assembled vertically on top of each other as a stack, with the physically larger-area chip of the two attached to the leadframe pad, and with clips providing the connections to the switch node and the stack top. Independent of the physical size, the sync FET chip needs a larger active area than the active area of the control FET chip, due to considerations of duty cycle and conduction loss. When both the sync chip and the control chip are assembled source-down, the larger (both physically and active area) sync chip is assembled onto the leadframe pad and the smaller (both physically and active area) control chip has its source tied to the drain of the sync chip, forming the switch node, and its drain to the input supply $V_{IN}$; a clip is connected to the switch node between the two chips. The pad is at ground potential and serves as a spreader of operationally generated heat; the elongated clip of the stack top is tied to input supply $V_{IN}$.

A typical converter described in the last paragraph is depicted in FIG. 1, generally designated 100. The control MOS field effect transistor (FET) 110 is stacked upon a synchronous (sync) MOSFET 120. The control FET chip 110 of this exemplary module has a smaller area relative to sync FET chip 120. A QFN metal leadframe has a rectangular flat pad 101 destined to become the heat spreader of the package; the leads 102a and 102b are positioned in line along two opposite sides of the pad; the other pad sides may be kept free of leads. The stacking of the FET chips is accomplished by the so-called source-down configuration: The source of sync FET 120 is soldered to the leadframe pad 101 by solder layer 121. A first clip 140, soldered by solder layer 122 onto the drain of sync FET 120, has the source of control FET 110 attached by solder layer 111; first clip 140 thus serves as the switch node terminal of the converter. A second clip 160 is connected by solder layer 112 to the drain of control FET 110. Second clip 160 is attached to lead 102b of the leadframe and thus connected to the input supply $V_{IN}$. This converter can operate efficiently at a frequency of 500 kHz up to 1 MHz.

SUMMARY

Applicants realized that it would be desirable for many applications (especially automotive and handheld products) to use power switches, which have only one power input yet provide multiple power outputs simultaneously. Such multi-output converters, also called multiphase half bridges, could be expanded to multiple power inputs and multiple power outputs working simultaneously.

In present technology, a multiphase bridge for two output voltages needs for each voltage channel: one packaged sync FET, one packaged control FET, and one packaged driver/controller, thus for two channels a total of six packaged components together with their corresponding consumption of circuit board (PCB) real estate area. In an analysis, applicants found that multi-output power switches could find a wide market with many applications if they would consume only minimal board area, in combination with low electrical impedances.

Applicants solved the problem of creating a single device producing two or more output voltages $V_{SW}$ from one input voltage $V_{IN}$ while only consuming minimal PCB area, when they discovered a methodology of integrating a first and a second vertical stack, each including a control n-channel FET on top of a sync n-channel FET, by merging the sync FETs into one chip of silicon so that they have only one source terminal on one chip surface and two or more adjacent drain terminals on the opposite chip surface.

In the methodology, one stack of FETs is needed for each output voltage $V_{SW}$, for example two stacks for two $V_{SW}$. The stacking is done so that both stacks share the electrical input and both stacks share the electrical ground. In each stack of an exemplary embodiment of chips fabricated with source on the bottom, the control chip is oriented source-down on the respective $V_{SW}$ clip, and the shared sync chip is oriented source-down on the common leadframe. For each output voltage as determined by the duty cycle regulated by the respective driver/controller chip, there is a separate $V_{SW}$ clip. The shared sync chip has a common source attached to the common leadframe, and two separate drains attached to the separate $V_{SW}$ clips. As stated, the actual values of the two different output voltages, as derived from the common input voltage, are determined by the duty cycles regulated by the two driver/controller chips.

In another exemplary embodiment having the control chip fabricated with its drain on the bottom while the sync chip is fabricated with its source on the bottom, the control has to be flipped for assembling it in a stack. After flipping, the control source can face the clip resting on the drain of the sync chip; extra clip segments have to be used to contact the gate terminals of the flipped chips.

As a result of the integration, the device with multi-output power switches avoids altogether the parasitic impedances of PCB traces. In addition, the stacked power FETs offer thermal and electrical efficiencies close to the theoretical maximum. The device permits direct implementation into PCBs without the headache of first modifying a footprint.

BRIEF DESCRIPTION OF THE DRAWINGS

FIGS. 6 to 10B depict certain process steps of assembling and packaging a multi-output power converter using FETs fabricated in drain-down configuration as integrated control chips and FETs fabricated in source-down configuration as integrated sync chips.

FIG. 6 illustrates the process step of attaching an integrated driver/controller chip and an integrated sync chip onto the pad of a leadframe.

FIG. 8 illustrates the process step of flip-attaching an integrated control chip onto the clips of FIG. 7A, whereby the gates of the FETs are connected to the additional clips shown in FIG. 7A.

FIG. 9 shows the process step of attaching a metal clip onto the integrated control chip.

FIG. 10B depicts a cross section through the assembly of FIG. 10A.

DETAILED DESCRIPTION OF THE PREFERRED EMBODIMENTS

Embodiments of a single electronic device creating two or more outputs from a single input can be found in electronic functions such as conversion and regulation, and the active electronic components employed to achieve these functions may be as diversified as MOS field effect transistors (MOSFETs), transistors based on GaN, GaAs and other III-V and II-IV materials, SiC, and bipolar transistors: For reasons of explanation and clarity, however, the following preferred embodiment focusses on the example of a multi-output power converter.

Figure 2:
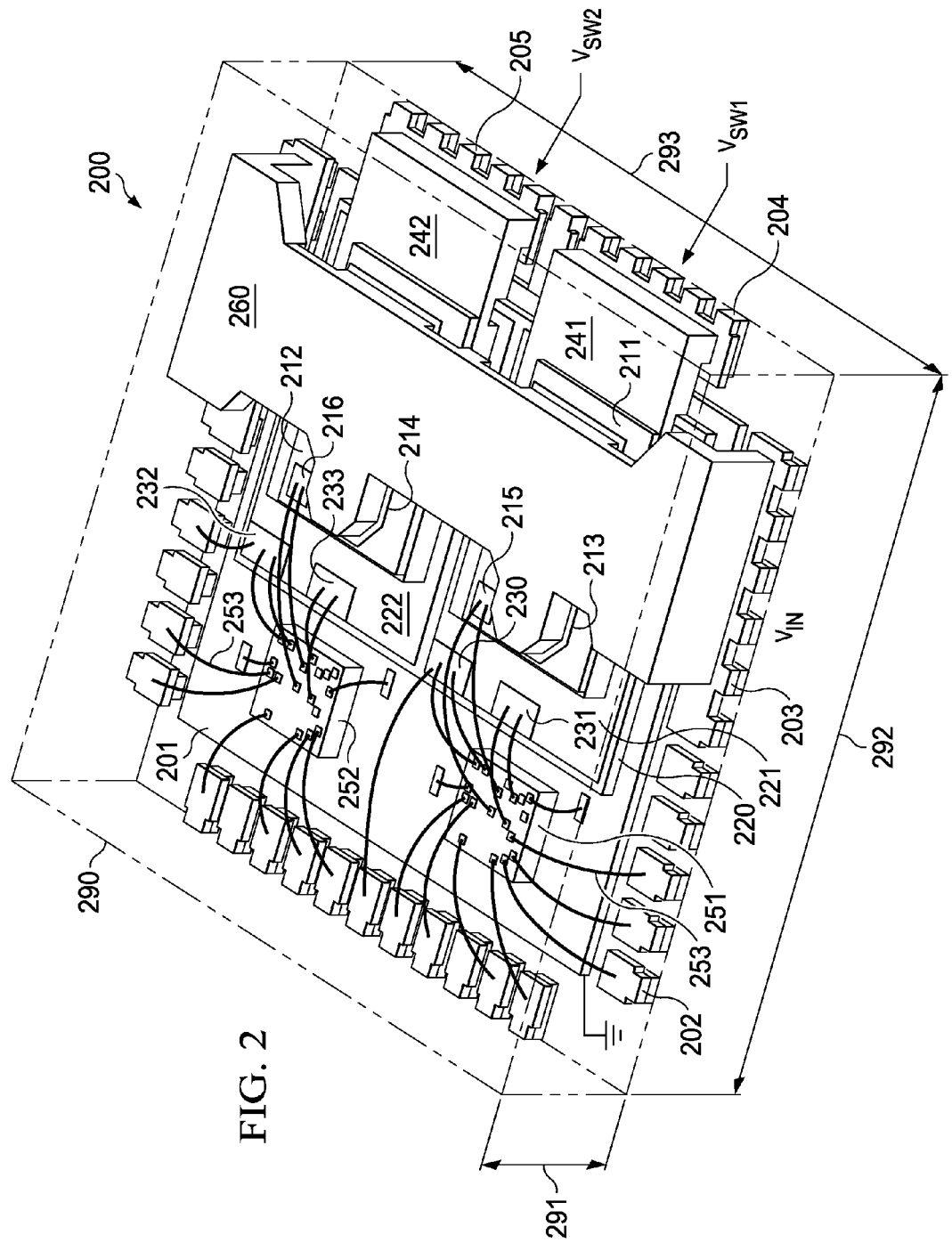
FIG. 2 illustrates a perspective view of an integrated multi-output power converter having vertically stacked semiconductor chips according to the invention.

FIG. 2 illustrates a perspective view of an embodiment of a multi-output power converter generally designated 200, which is shown with a transparent encapsulation 290. Preferred actual encapsulation uses a black-colored epoxy formulation for a transfer molding technology. The exemplary converter of FIG. 2 has a length 292 of 7 mm, and a width 293 of 5 mm, and a thickness 191 of 1.0 mm. Converter 200 is constructed on a substrate, which may be a metallic leadframe or a laminate using tapes. In all cases, the substrate has a pad for assembling (preferably by soldering) the chips or stack of chips, and a plurality of terminals such as metallic leads and metal contact pads.

Visible through the transparent encapsulation is a metal leadframe generally suitable for Quad Flat No-Lead (QFN) and Small Outline No-Lead (SON) type modules. The leadframe includes a rectangular pad 201 and a plurality of leads 202. These leads may be approximately uniformly distributed on all four sides of the pad as in the exemplary device shown in FIG. 2, or they may be distributed so that one or more sides of the leadframe may be free of leads. Pad 201 may operate as the ground terminal of the converter, and at least one lead 203 is the electrical input terminal $V_{IN}$. The leadframe is preferably made of copper or a copper alloy; alternative metal selections include aluminum, iron-nickel alloys, and Kovar™. Both surfaces of the leadframe may be prepared to facilitate solder attachment, for instance by a sequence of plated layers of nickel, palladium, and gold. In addition, the at least one surface may have a metal layer deposited to enhance thermal conductivity, for instance by a plated layer of silver. Preferred thickness of the leadframe metal for the exemplary embodiment shown in FIG. 2 is 0.2 mm; other embodiments may use thinner or thicker leadframe metal. From the standpoint of low cost and batch processing, it is preferred to start with sheet metal and fabricate the leadframe as a strip by stamping or etching, and to singulate the leadframe for the module by trimming the strip after the encapsulation process.

Figure 1:
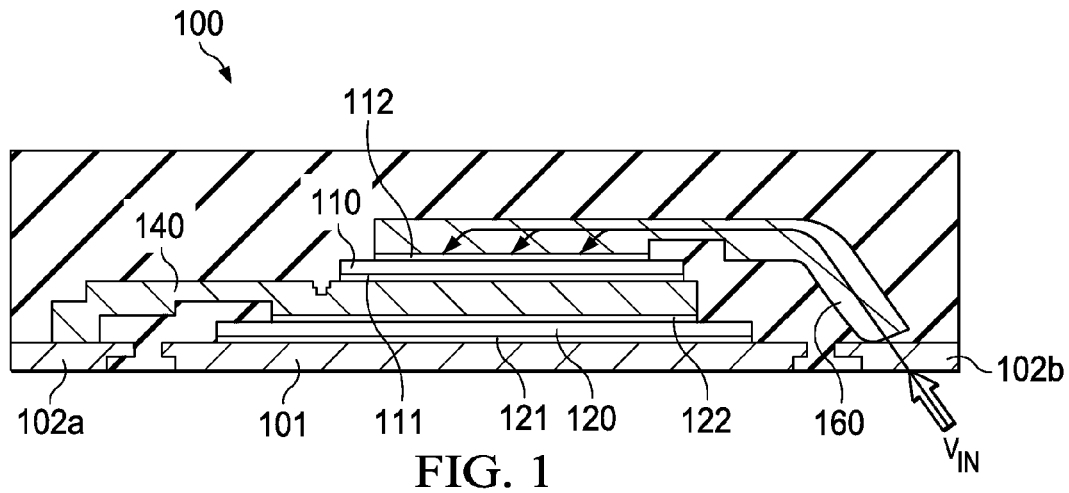
FIG. 1 shows a cross section of a synchronous Buck converter assembled according to prior art, wherein a large-area sync FET chip is attached to a leadframe pad and topped by a small-area control FET chip; the latter is connected by an elongated clip to leads.

FIG. 2 shows a first chip 220 affixed to pad 201. For the embodiment shown in FIG. 2, chip 220 has a size of about 3.5×2.85 mm, and a thickness of 0.1 mm. For other embodiments, the chip size and the chip thickness may have significantly smaller or greater values. Chip 220 has a first and a second field-effect transistor merged so that one chip surface (not shown in FIG. 1) has the common source terminal of the transistors. Chips with merged or integrated transistor terminals may be referred to herein as composite chips. The chip surface with the common terminal is affixed to pad 201. The preferred method of affixing is by soldering using a wafer-level solder application method such as plating or screen printing. The solder material, for instance a solder paste, is selected so that the same material can be used for all solder joints of the multi-output power converter, allowing a single solder reflow step for assembling the converter. The preferred thickness of solder layers is at least 25 µm.

On the opposite chip surface (remote from pad 201), chip 220 has a first drain terminal 221, belonging to the first of the merged transistors, and a second drain terminal 222, belonging to the second of the merged transistors. Drain terminals 221 and 222 are positioned adjacent to each other, without scribe line between them. The first field-effect transistor comprising the source terminal of chip 220 and first drain terminal 221 is herein referred to as $Q_1$; the second field-effect transistor comprising the source terminal of chip 220 and second drain terminal 222 is herein referred to as $Q_2$. First drain terminal 221 is connected by a first metal clip 241 to a first output lead 204. Second drain terminal 222 is connected by a second metal clip 242 to a second output lead 205. The preferred metal for clips 241 and 242 is copper due to its good electrical and thermal conductivity, suitable for power transistors. As a result, first chip 220 is operable as the sync FET chip of power converter 200.

For the purposes of this description, the terms clip and gang clip will be understood to refer to preformed conductive interconnects of a power transistor module, which are attached to a power transistor after the power transistor is singulated from a semiconductor wafer containing other units of power transistors. A clip may be provided as a piece part, a gang chip is provided as a unit of a network held together by rails, which will be trimmed at time of singulation.

As FIG. 2 illustrates, a second chip 211 and a third chip 212 are positioned vertically over first chip 220. Specifically, second chip 211 is positioned vertically over first drain terminal 221 and third chip 212 is positioned vertically over second drain terminal 222. These vertical chip positions are frequently referred to as stacking of chips. For the embodiment shown in FIG. 2, chips 211 and 212 each have a size of about 2.5×1.8 mm, and a thickness of 0.1 mm. For other embodiments, the die size and the die thickness may significantly to smaller or to greater values. Chip 211 has an FET (herein referred to as third transistor $Q_3$) with its source terminal (not shown in FIG. 2) attached to first clip 241, rendering clip 241 a first switch node $V_{SW1}$, and chip 212 has an FET (herein referred to as fourth transistor $Q_4$) with its source terminal (not shown in FIG. 2) attached to second clip 242, rendering clip 242 a second switch node $V_{SW2}$. The preferred method of attaching is by soldering; preferred thickness of the solder layers is about 25 µm. As FIG. 2 shows, first clip 241 and second clip 242 have a structure to function as respective switch nodes between the respective drains of sync chip 220 and the respective sources of chips 211 and 212 as control chips. The clips also operate as low impedance contacts of the switch node to a plurality of leads 204 and 205 capable of conducting the load current to the output inductor. Clips 241 and 242 are preferably made of copper in the thickness range from about 0.2 to 0.3 mm; both surfaces of the clips are preferably solderable. First clip 241 and second clip 242 are preferably employed in strip form and etched to acquire their contours and thicknesses.

The field-effect transistor comprising the source terminal of second chip 211 and drain terminal 213 is herein referred to as $Q_3$; the field-effect transistor comprising the source-terminal of third chip 212 and drain terminal 214 is herein referred to as $Q_4$. The drain terminal 213 of second chip 211 and the drain terminal 214 of third chip 212 are attached onto a common metal clip 260, referred to as third clip. The preferred method of attaching is by soldering with a solder layer of about 25 µm thickness. As FIG. 2 shows, common clip 260 has a structure to function as low impedance contact of the drain terminals of the control FETs to the input supply, capable of conducting the input current. Common clip 260 is preferably made of copper in the thickness range from about 0.2 to 0.3 mm, more preferably about 2.5 mm. The bottom surface of common clip 260 is solderable. Common clip 260 is preferably employed in strip form and etched to acquire its contours and thicknesses.

As FIG. 2 shows, common clip 260 is connected to the input lead 203 as input terminal. As a result, second chip 211 and third chip 212 are operable as respective control chips of converter 200. For the embodiment shown in FIG. 2, chip 220 has a size of about 3.5×2.85 mm, and a thickness of 0.1 mm. For other embodiments, the chip size and the chip thickness may have significantly smaller or greater values.

FIG. 2 depicts first chip 220 to include a first gate terminal 230 and a first gate return terminal 231 adjacent to first drain terminal 221, and further a second gate terminal 232 and a second gate return 233 adjacent to second drain terminal 222. The terminals of sync FET chip 220 are metallurgically suitable for wire bonding. In addition, second chip 211 includes a gate terminal 215 adjacent to drain terminal 213, and third chip 212 includes a gate terminal 216 adjacent to drain terminal 214. The terminals of control FET chips 221 and 222 are metallurgically suitable for wire bonding.

It should be noted that the concept of component integration into one chip combined with stacking of chips can be extended to any number of components within each chip and any number of vertically stacked components. Consequently, the device applications include multi-output power converters, regulators, applications with sensing terminals or Kelvin terminals, and others.

The multi-output converter 200 further includes a first driver/controller chip 251 and a second driver/controller chip 252; these chips provide the driver and control functions to the converter and determine, by setting the duty cycles, the DC output voltages of the converter relative to the DC input voltage. As examples, from an input voltage 0f 12 v, a duty cycle of 0.5 enables an output voltage of 6 V; a duty cycle of 0.25 enables an output voltage of 3 V. Both driver/controller chips are attached to leadframe pad 201 and positioned in close proximity to sync chip 220. In the exemplary embodiment of FIG. 2, the distance between chips 251 and 252, and chip 220 is about 300 µm. Chips 251 and 252 have back side metallization to allow attachment to leadframe pad 201 by solder (layer thickness preferably about 25 µm). The metallic solder provides high thermal conductivity for spreading heat from chips 251 252 to pad 201. Besides soldering, conductive epoxy or silver sintering are other possible chip and clip attach techniques. In the exemplary embodiment shown in FIG. 2, chips 251 and 252 are square shaped (side length about 1.4 to 1.5 mm) and 0.2 mm thick. Other embodiments may have chips, which are smaller or greater, and thicker or thinner. Still other embodiments may combine both driver/controller chips into a single chip. Furthermore, in some converters chips 251 and 252 and chips 220, 211 and 212 may have the same thickness. First driver/controller chip 251 is electrically connected (for instance by bonding wires) to gate terminal 230 and gate return terminal 231, and further to gate terminal 215. Second driver/controller chip 251 is connected (for instance by bonding wires) to gate terminal 232 and gate return terminal 233, and further to gate terminal 216.

First driver/controller chip 251 is electrically connected (for instance by bonding wires) to gate terminal 230 and gate return terminal 231, and further to gate terminal 215. Second driver/controller chip 252 is connected (for instance by bonding wires) to gate terminal 232 and gate return terminals 233, and further to gate terminal 216. The difference between the width of rectangular pad 201 and the relatively smaller side lengths of chips 251 and 252 provides a distance between chip terminals and leads, which may be as significant as indicated in FIG. 2. This distance stretches the wire spans from chip terminals to respective leads such that any height difference due to the thickness of chips 251 and 252 becomes insignificant. Consequently, the wire connections 253 can be provided without downhill bonding, enhancing the reliability of the converter assembly. The preferred diameter of bonding wires 253 is about 25 µm, but may be smaller or greater.

Figure 3:
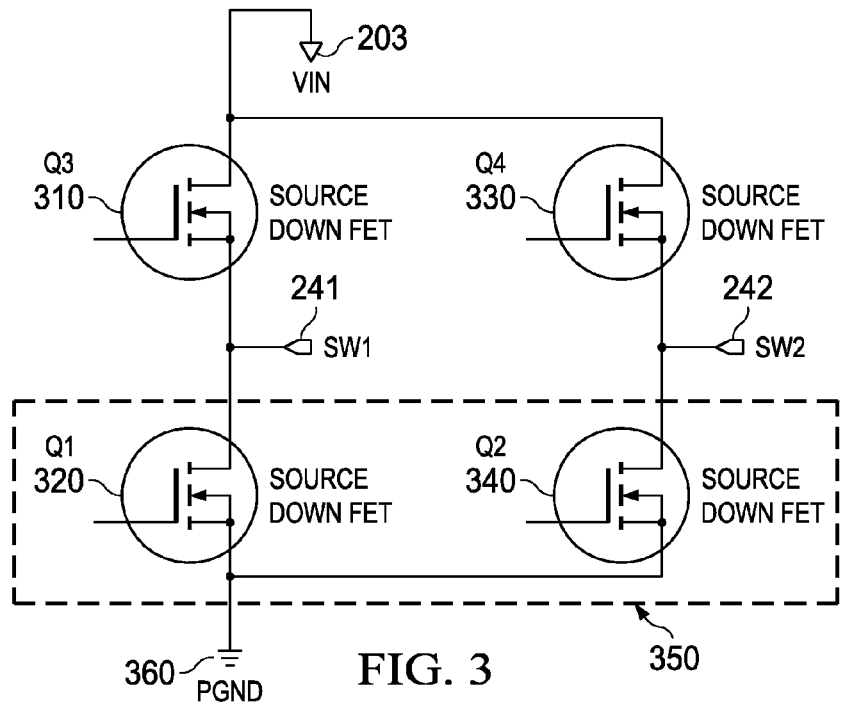
FIG. 3 shows a circuit diagram of the converter of FIG. 2 using FETs fabricated in source-down configuration; the dashed outline indicates an integrated sync chip.

FIG. 3 represents a simplified circuit diagram of the embodiment of FIG. 2. Field-effect transistors $Q_3$ (310) and $Q_1$ (320) are source-down transistors. The chip of $Q_3$ (211 in FIG. 2) is vertically stacked onto the chip of $Q_1$ (220 in FIG. 2) so that the transistors share switch node $SW_1$ (241). Field-effect transistors $Q_4$ (330) and $Q_2$ (340) are source-down transistors. The chip of $Q_4$ (212 in FIG. 2) is vertically stacked onto the chip of $Q_2$ (220 in FIG. 2) so that the transistors share switch node $SW_2$ (242). Transistors $Q_3$ and $Q_4$ are connected (by common clip 260) to share the same input terminal $V_{IN}$ (203). Transistors $Q_1$ and $Q_2$ are connected (by leadframe pad 201) to share the same electrical ground terminal 360. As indicated by dashed outline 350, transistors $Q_1$ and $Q_2$ are integrated into the single chip 220.

Figure 4:
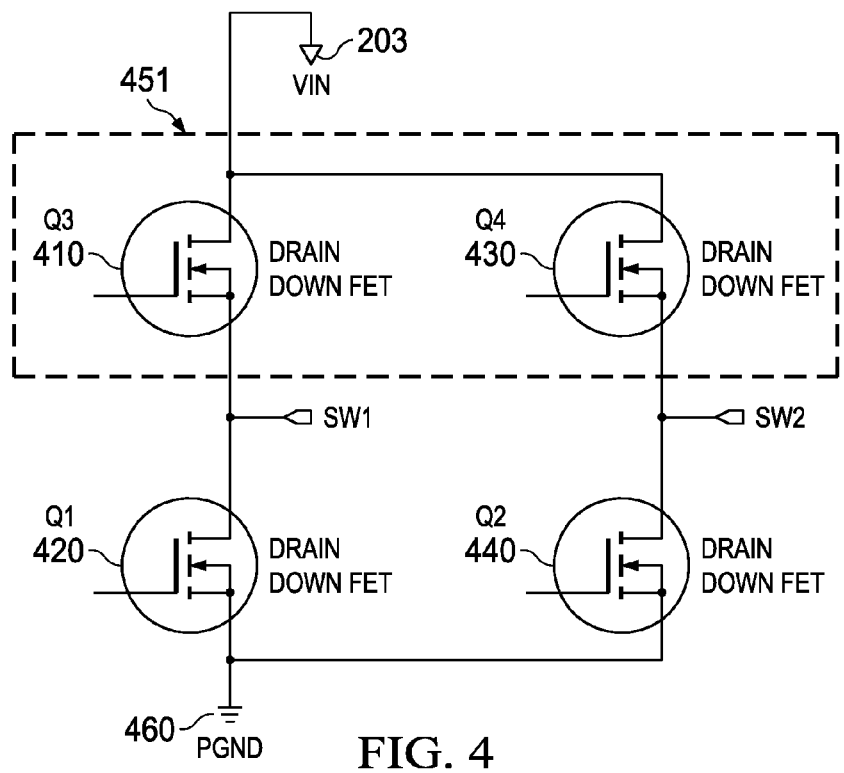
FIG. 4 shows an analogous circuit diagram of a multi-output power converter using FETs fabricated in drain-down configuration; the dashed outline indicates an integrated control chip.

An analogous circuit diagram and analogous considerations hold for another embodiment wherein the chips are manufactured so that transistors $Q_3$ (410) and $Q_1$ (420) as well as transistors $Q_4$ (430) and $Q_2$ (440) are drain-down transistors. For this configuration, the circuit diagram is depicted in FIG. 4. As indicated by dashed outline 451, transistors $Q_3$ and $Q_3$, both drain-down transistors, are integrated into a single chip. This common chip is vertically placed onto the chips of transistors $Q_1$ and $Q_2$ so that the transistors $Q_3$ and $Q_1$ can share switch node $SW_1$, and the transistors $Q_4$ and $Q_2$ can share switch node $SW_2$. Transistors $Q_3$ and $Q_4$ are connected to share the same input terminal $V_{IN}$ (203). Transistors $Q_1$ and $Q_2$ are connected to share the same electrical ground terminal 460. Since the gate terminals in transistors $Q_1$ and $Q_2$ are located on the same side of the chip as the source terminal, they have to be electrically isolated from the source terminals. A connection between the $Q_1$ and $Q_2$ gates to their respective pins or driver terminals can for example be realized by means of leadframe patterning or generally package substrate (e.g. laminate) patterning. Connections to the driver can, for example, be realized by wire bonding. In an actualization of this concept, the gates of transistors $Q_1$ and $Q_2$ face the leadframe; consequently, the leadframe pad has to be designed with subdivisions to allow electrically separate connections to the gates of transistors $Q_1$ and $Q_2$. FIG. 4 can also be used for the case of drain-down transistors with the substrate of the package at $V_{IN}$.

In another embodiment of the invention, transistors $Q_3$ and $Q_4$ are fabricated as drain-down FETs while transistors $Q_1$ and $Q_2$ are fabricated as source-down FETs. This embodiment is summarized in the simplified circuit diagram of FIG. 5, and described in more detail by the assembly process steps of FIGS. 6 to 9, resulting in the finished and packaged multi-output converter illustrated by the top view of FIG. 10A and the cross section of FIG. 10B, generally designated 1000. As FIG. 5 indicates, the embodiment allows the integration of transistors $Q_3$ and $Q_4$ into a single chip, indicated by outline 551, as well as the integration of transistors $Q_1$ and $Q_2$ into another single chip, indicated by outline 550.

The assembly method is suitable for fast and low-cost batch processing, since all attachments may be performed by a single solder material and a single reflow temperature so that a single one-step-fits-all attachment process can be employed. The solder paste is selected so that the solder reflow temperature is higher than the temperature of wire bonding. Further, downhill wire bonding is almost completely avoided; the temperature for wire bonding is lower than the solder reflow temperature. In addition it is preferred that piece parts, such as leadframe and clips, are provided in strip form and are only singulated after the encapsulation step.

The positions of parts in a 3-dimensional composite, such as a stack of semiconductor chips, may be described with geometrical connotations, such as "low side" or "high side". Since the exemplary embodiment described below is a multi-output power converter of the synchronous Buck converter type, the positions of parts can also be expressed in functional connotations such as "sync" or "control".

Figure 5:
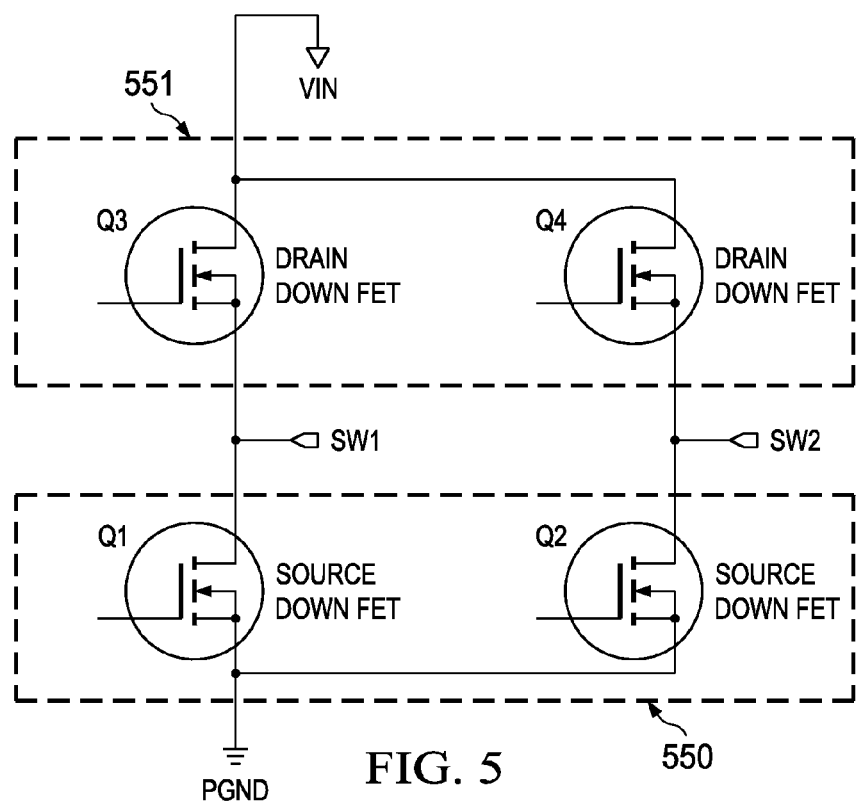
FIG. 5 shows a circuit diagram of a multi-output power converter using FETs fabricated in drain-down configuration as control chips and FETs fabricated in source-down configuration as sync chips; the dashed outlines indicate integrated chips.
Figure 6:
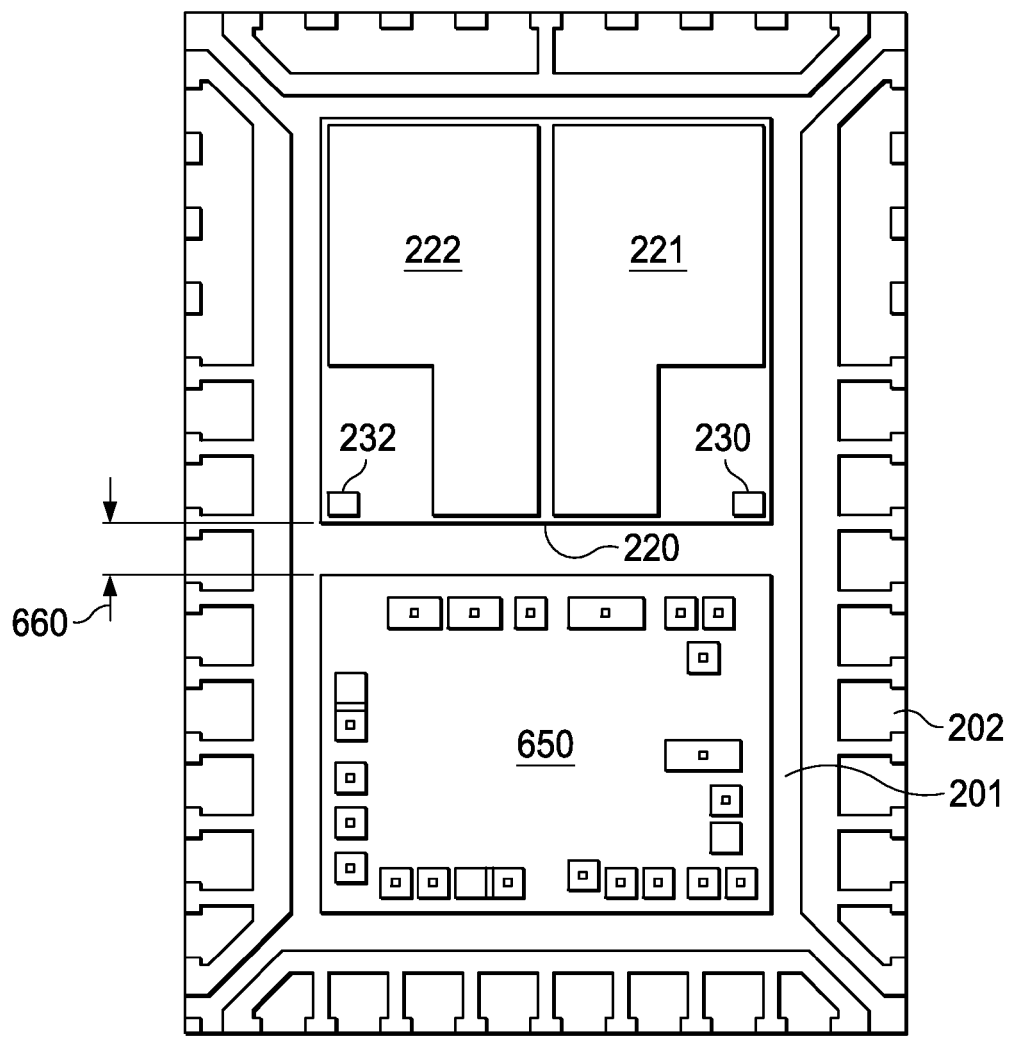

The first phase of the assembly method for the embodiment of FIG. 5 is depicted in FIG. 6. The method starts with the step of providing a substrate, in this example a metallic leadframe, which has a rectangular flat assembly pad 201 and a plurality of terminal leads 201 positioned in line with the sides of the pad. A preferred leadframe metal is copper or a copper alloy in a thickness range from about 150 to 250 µm; other options include aluminum, an iron-nickel alloy, and Kovar™. Both surfaces of the pad have a metallurgical disposition, which facilitates solder wetting and solderability. As an example for copper leadframes, the pad surfaces may have additional plated layers of nickel, palladium and gold (outermost). For the leads, the surfaces facing the chips-to-be-assembled are wire bondable (preferred wire metals are gold and copper), for instance by a spot-plated layer of gold. The opposite lead surfaces are preferably solderable. Alternatively, a substrate of a laminate foil structure may be used, which has an assembly pad and a plurality of metallic terminals.

In the next step, a solder mixture is selected, preferably configured as a tin-based paste, which has a reflow temperature higher than the temperature used for wire bonding (about 220° C.); the paste is used throughout the assembly.

The assembly starts by placing a driver-and-controller chip 650 on the leadframe pad 201 using a layer of solder paste with thickness about 25 µm or greater; the solder paste may be dispensed on pad 201 by a syringe or by screen printing. Chip 650 has back side metallization (for instance a layer of nickel or titanium-tungsten followed by a layer of palladium) in order to render the back side of semiconductor chip 650 solderable.

In the next step, low side FET (sync FET) chip 220, which integrates two integrated source-down FETs, is placed source-down adjacent to driver-and-controller chip 650 onto a layer of solder paste dispensed on pad 201. The source-down placement of FET chip 220 has the common source of the two integrated sync FETs face the leadframe pad. As a result, the top view of FIG. 6 displays the drain terminals 221 and 222 of the two integrated FETs. FIG. 6 also shows the two gate terminals 230 and 232 of the integrated FETs adjacent to the drain terminals 221 and 222, respectively. The preferred thickness of the assembly solder layer is about 25 µm or greater. In order to keep parasitics as small as possible, the distance 660 between chip 650 and chip 220 is preferably selected as narrow as assembly layout rules allow, without risking an accidental merging of the adjacent meniscus of the liquefied solder layers and during the reflow process, which would be coupled with surface tension-induced relative movements of chips 650 and 220. As an example, for certain solder alloys and layer thicknesses, about 300 µm is a preferred distance.

Figure 7A:
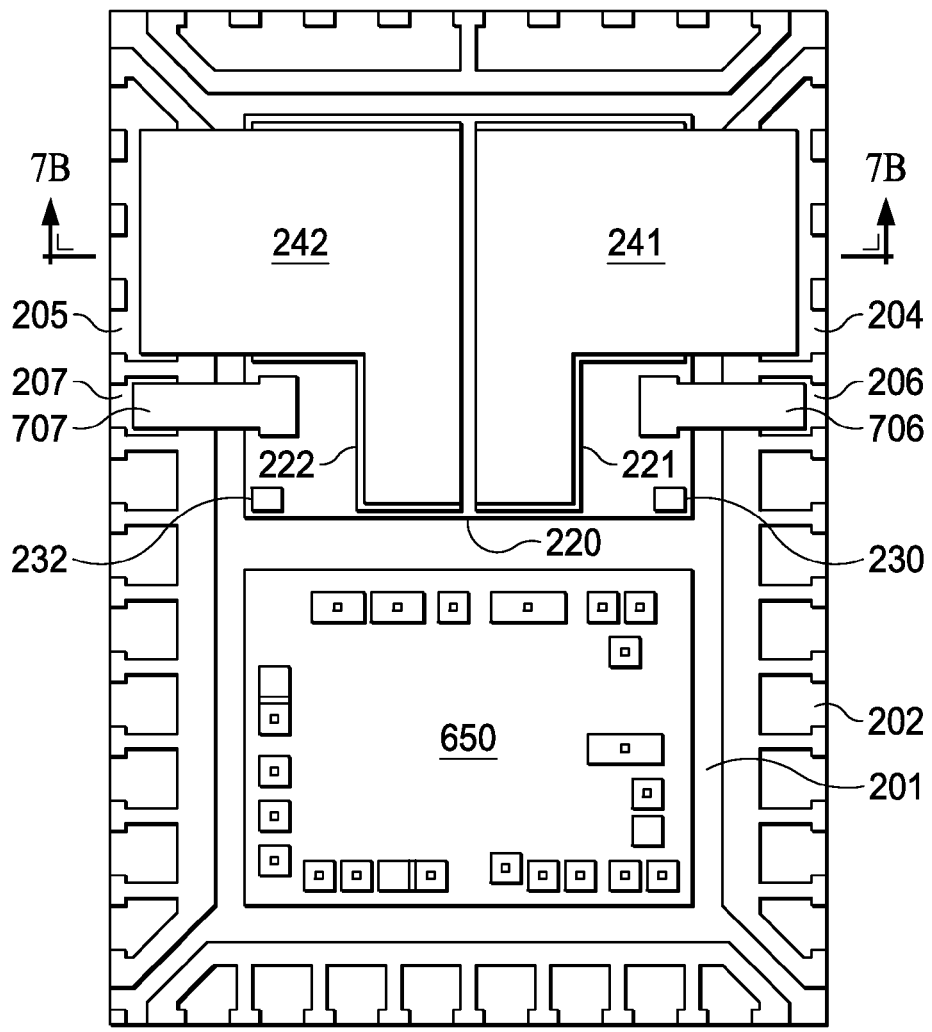
FIG. 7A shows the process step of attaching metal clips onto the sync chip and additional clips to gate leads.
Figure 7B:
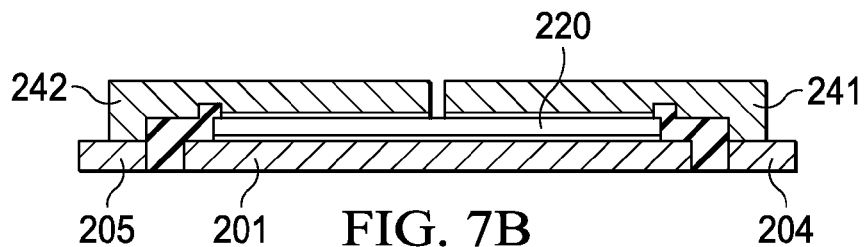
FIG. 7B depicts a cross section through the assembly of FIG. 7A.

FIGS. 7A and 7B illustrate the next process steps, which involve the placing and attaching of metal clips, which are preferably provided as gang clips (low side gang clip attach). A metallic clip 241, herein called the first clip, and another metallic clip 242, herein called the second clip, are deposited onto a layers of solder paste on the drain terminals 221 and 222. First clip 241 and second clip 242 are preferably gang clips; they are shaped to serve as switching nodes of the multi-output converter; by stamping and forming or etching of the starting metal sheet (about 0.2 to 0.3 mm thick), the clips have obtained a structure so that clip portions get to rest on first output lead 204 (first switching node $V_{SW1}$) and on second output lead 205 (second switching node $V_{SW2}$). Cross sections of clips 241 and 242 are depicted in FIG. 10B. With the attachment of first clip 241 and second clip 242, first FET chip 220 is operable as the sync chip of the converter.

FIG. 7A further shows the placing of additional metal clips, which are preferably provided as gang clip segments. Lead 206, which is dedicated as gate lead, has clip segment 706 attached (herein referred to as fourth clip), and lead 207, which is dedicated as another gate lead, has clip segment 707 attached (herein referred to as fifth clip). Until the next assembly step, the ends of both clip segments remote from the respective leads rest loosely on the insulator-protected surface of chip 220. The protecting insulators may be silicon nitride, silicon dioxide, polyimide or other suitable ship passivations.

Figure 8:
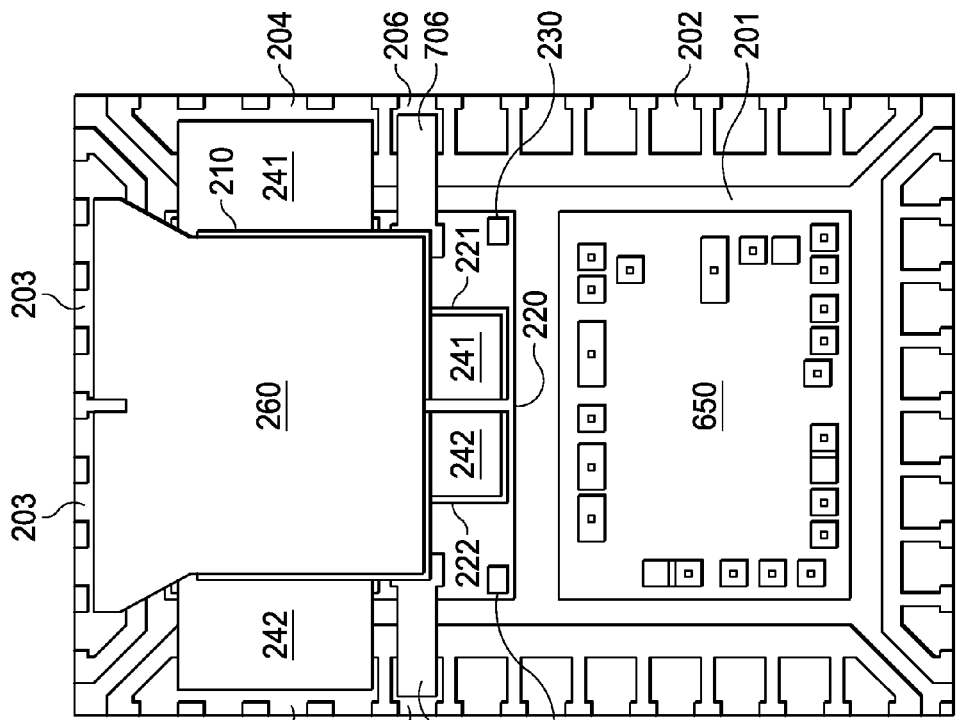

In the next assembly step, illustrated in FIG. 8, high side FET (control FET) chip 210 is placed onto layers of solder paste dispensed on clips 241 and 242, vertically stacked over sync chip 220. Chip 210 includes dual FETs; both are fabricated as drain-down FETs so that the source terminals and adjacent gate terminals are on one chip surface, and the drain terminals are on the opposite chip surface. However, for the assembly depicted in FIG. 8, chip 210 is flipped so that the source and gate terminals face the sync chip 220 and the drain terminals 213 and 214 are facing away from the sync chip. After flipping chip 220, the respective source terminals (not shown in FIG. 8) are aligned with clips 241 and 242, covered with a layer of solder paste. When chip 210 is lowered to bring the source terminals in contact with the solder layers, the gate terminals (not shown in FIG. 8) are simultaneously brought in contact with the (solder layer-covered) clips 706 and 707, respectively. As a result, leads 206 and 207 become the gate leads (high side gate leads) for the FETs of chip 210.

Figure 9:
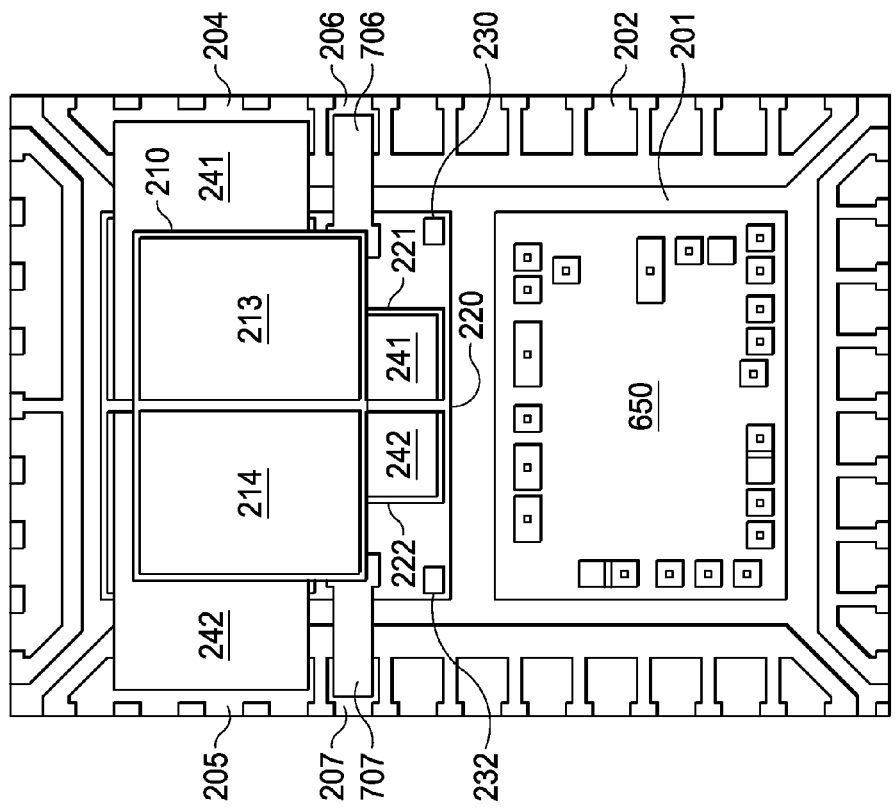

FIG. 9 depicts the step of attaching the common clip (high side clip, third metal clip) 260 to the drain terminals 213 and 214 of the high side (control chip) 210. Clip 260 is preferably provided as a gang clip. Third clip 260, destined to become the connector to the input supply $V_{IN}$ of the multi-output converter, has obtained, by stamping and forming or etching of the starting metal sheet (about 0.2 to 0.3 mm thick), a structure so that concurrently with the placement on the control FET chip 210 a clip portion gets to rest on a layer of the same solder paste dispensed on (at least one) lead 203 of the leadframe. Leads 203 serve as the input terminal of the converter, connecting to the input supply $V_{IN}$.

In the next process step, thermal energy is supplied to raise the temperature for reflowing the layers of solder paste at the solder melting temperature. The solder alloy is selected so that the solder reflow temperature is substantially higher than the temperature needed for the wire bonding in the next process step. Since all solder layers are made of the same material, all solder connections are accomplished concurrently by a single reflow step. This simplifying feature contributes significantly to a low cost of the fabrication method.

Figure 10A:
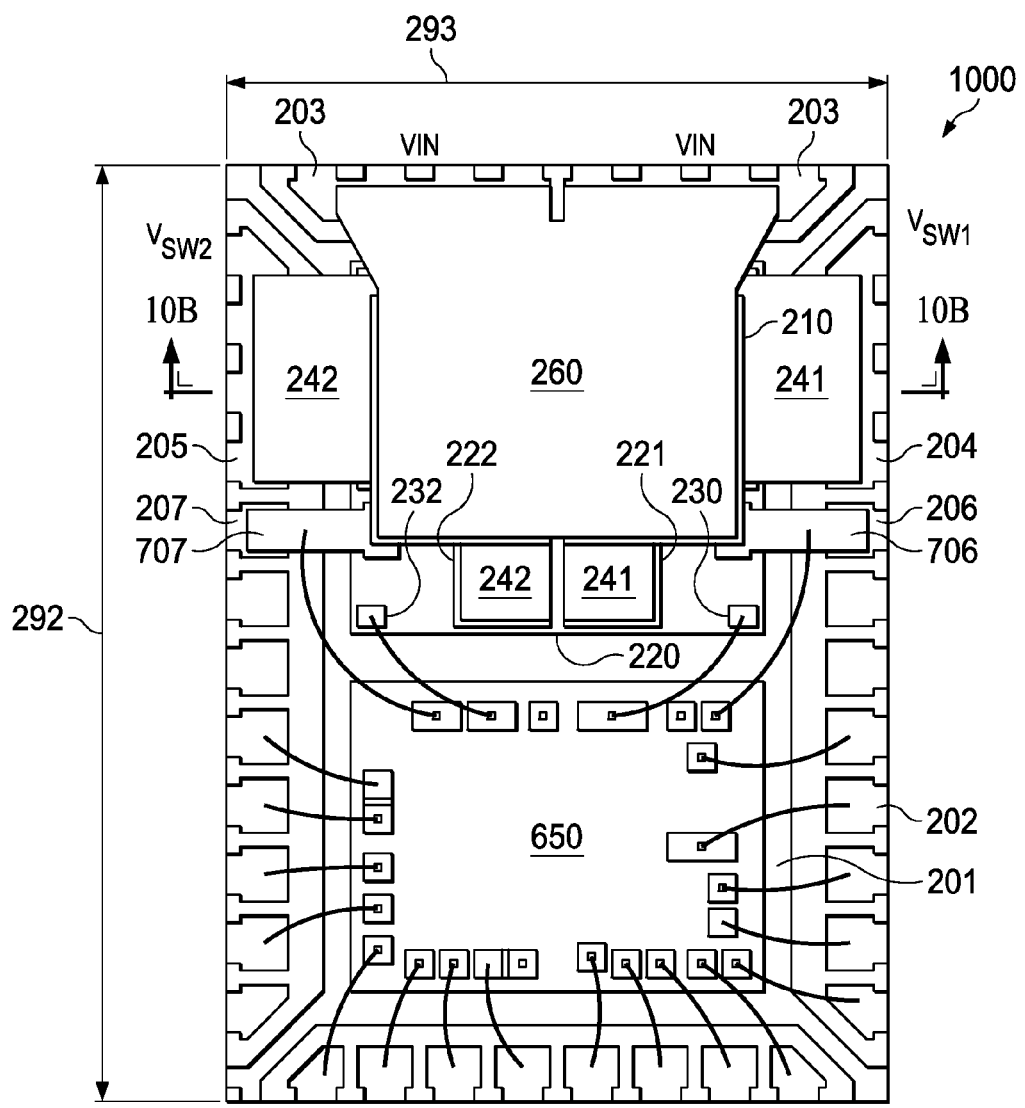
FIG. 10A illustrates the process step of wire-bonding the integrated driver/controller chip to respective terminals of the sync and control FETs; furthermore, input ($V_{IN}$) leads and output $V_{SW1}$ and $V_{SW2}$ leads are indicated.
Figure 10B:
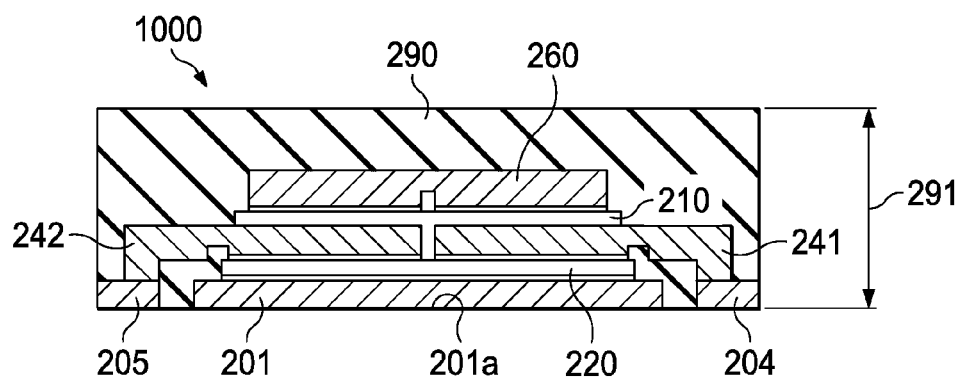

FIGS. 10A and 10B depict the next process step of wire bonding. Preferably, wires (or occasionally ribbons) of gold or copper are used to connect the terminals of the driver-and-control chip 650 to respective leads of the leadframe, and further to the gate terminals and gate return terminals of the sync FET chip and the gate clips connecting to the gates of the control FET chip. The bonding steps avoid downhill bonding almost completely and thus minimize the well-known reliability issue of wire shorting during the encapsulation step.

FIG. 10B indicates the next process step of encapsulating the driver/control chip 650, the sync FET chip 220, the control FET chip 210, the metal clips, and the wire bonds in a packaging compound 290, thus creating the external dimensions of converter 1000. The bottom 201a of pad 201 and the bottoms of the leads are left un-encapsulated so that pad bottom surface 201a and the lead bottom surfaces can be soldered to a substrate or a circuit board which may also be a heat sink. Since the compound thickness over second clip 260 can be kept small, the total thickness 291 of the exemplary converter may be kept to 1.5 mm. It is possible to reduce this thickness further by keeping the top surface of second clip 260 un-encapsulated, a feature enabled by the fact that no wire bonding is involved for connecting the driver/control FET to the drain terminals and the gate terminals of the control FET.

The overall dimensions of exemplary converter 1000 may be length 292 about 7 mm and width 293 about 5 mm.

For reasons of batch processing and low fabrication cost, it is preferred to provide the leadframe, the first clip and the second clip in strip form. In a trimming process step, the encapsulated strips are singulated into discrete converter units like the converter depicted in FIG. 2. A preferred singulation technique is sawing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors, to bipolar transistors, insulated gate transistors, thyristors, and others.

As another example, the above considerations for structure and fabrication method of multi-output power converters apply to multi-output regulators, multi-output power converters, applications with sensing terminals, applications with Kelvin terminals, and others.

As another example, the high current capability of the multi-output converter can be further extended, and the efficiency further enhanced, by leaving the top surface of the second clip un-encapsulated so that the second clip can be connected to a heat sink, preferably by soldering. In this configuration, the hexahedron-shaped module can dissipate its heat from both large surfaces to heat sinks.

As another example, the concept of component integration into one chip combined with stacking of chips can be extended to any number of components within each chip and any number of vertically stacked components.

It is therefore intended that the appended claims encompass any such modifications or embodiments.

We claim:
1. An electronic multi-output device comprising:
   a substrate comprising:
      a first pad;
      a second pad;
      a plurality of pins;

a first chip with a first transistor having a first chip first terminal on one chip surface and a first chip second terminal and a first chip third terminal on an opposite chip surface, the first chip first terminal tied to the first pad;

a second chip with a second transistor having a second chip first terminal on one chip surface and the second chip second terminal and a second chip third terminal on the opposite chip surface, the second chip first terminal tied to the second pad;

the first chip second terminal and second chip second terminal connected by a discrete first clip and a discrete second metal clip to respective substrate pins; and a composite third chip having a third transistor and a fourth transistor integrated so that a first terminal of the third transistor and a first terminal of the fourth transistor are on one chip surface, and a second terminal of the third transistor and a second terminal of the forth transistor merged into a common terminal, and a patterned third terminal of the third transistor and a patterned third terminal of the fourth transistor are on an opposite chip surface;

the first terminal of the third transistor and the first terminal of the fourth transistor vertically attached to the discrete first clip and the discrete second metal clip, respectively, and the common terminal connected by a common clip to a substrate pin.

2. The device of claim 1 the first and second pads are connected to an electrical ground potential, and the substrate pin with the common clip is connected to a $V_{IN}$.

3. The device of claim 1 wherein the first, second, third and fourth transistors are drain-down MOS field-effect transistors, with the first terminals being the drain terminals, the second terminals being the source terminals, and the third terminals being the gate terminals of the respective transistors.

4. The device of claim 1 wherein the device is a power converter.

5. The device of claim 1 wherein the device is regulator.

6. The device of claim 1 wherein the substrate is a leadframe.

7. The device of claim 1 wherein the substrate is a laminate.

8. The device of claim 1 wherein the substrate is a foil.

9. The device of claim 1 wherein the chips are made of a material selected from a group including SiC, GaN, GaAs, and other III-V and II-IV compounds.

* * * * *